United States Patent
Li et al.

(10) Patent No.: US 9,841,797 B2
(45) Date of Patent: Dec. 12, 2017

(54) POWER SUPPLY SWITCH APPARATUS

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Dao-Wei Li, Wuhan (CN); Chun-Sheng Chen, New Taipei (TW)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 360 days.

(21) Appl. No.: 14/683,689

(22) Filed: Apr. 10, 2015

(65) Prior Publication Data

US 2016/0172135 A1    Jun. 16, 2016

(30) Foreign Application Priority Data

Dec. 12, 2014    (CN) .......................... 2014 1 0760831

(51) Int. Cl.
*G06F 1/26* (2006.01)
*G11C 5/14* (2006.01)

(52) U.S. Cl.
CPC ............... *G06F 1/263* (2013.01); *G06F 1/26* (2013.01); *G11C 5/141* (2013.01)

(58) Field of Classification Search
CPC .................................. G06F 1/263; G11C 5/141
See application file for complete search history.

(56) References Cited

U.S. PATENT DOCUMENTS

| | | | | |
|---|---|---|---|---|
| 5,550,494 A * | 8/1996 | Sawada | .................. | G11O 5/143 327/408 |
| 6,963,933 B2 * | 11/2005 | Saito | ....................... | G06F 1/266 710/1 |
| 7,196,572 B2 * | 3/2007 | Schneider | ........... | G11C 11/4074 327/538 |
| 7,329,969 B2 * | 2/2008 | Niinuma | .................. | G06F 1/263 307/130 |
| 7,576,600 B2 * | 8/2009 | Jiang | ....................... | G06F 1/263 307/80 |
| 8,664,798 B2 * | 3/2014 | Nozaki | ..................... | H02J 1/08 307/43 |
| 9,122,469 B2 * | 9/2015 | Wu | ......................... | G06F 1/263 |
| 9,329,649 B2 * | 5/2016 | Gasparini | ................ | G06F 1/26 |
| 9,653,946 B2 * | 5/2017 | Lin | ......................... | G06F 1/263 |

(Continued)

*Primary Examiner* — Thomas J Hiltunen
(74) *Attorney, Agent, or Firm* — Steven Reiss

(57) ABSTRACT

A power supply switch apparatus includes a first interface, a switch circuit, and a power supply circuit. The first interface includes a first control signal output terminal, a second control signal output terminal, and a third control signal output terminal. Each of the first control signal output terminal, the second control signal output terminal, and the third control signal output terminal outputs a control signal according to an electronic device inserted in the first interface. The switch circuit receives the control signals and outputs a power supply signal accordingly. The power supply circuit receives the power supply signal, and provides a first direct current (DC) voltage or a second DC voltage to the electronic device according to the power supply signal.

19 Claims, 3 Drawing Sheets

(56) References Cited

U.S. PATENT DOCUMENTS

| | | | |
|---|---|---|---|
| 2005/0132236 A1* | 6/2005 | Srinivasan | G06F 13/4081 |
| | | | 713/300 |
| 2013/0124880 A1* | 5/2013 | Luo | G06F 1/263 |
| | | | 713/300 |
| 2016/0179182 A1* | 6/2016 | Horie | G06F 1/1626 |
| | | | 713/323 |

* cited by examiner

POWER SUPPLY SWITCH APPARATUS

CROSS-REFERENCE TO RELATED APPLICATIONS

This application claims priority to Chinese Patent Application No. 201410760831.9 filed on Dec. 12, 2014, the contents of which are incorporated by reference herein.

FIELD

The subject matter herein generally relates to a power supply switch apparatus.

BACKGROUND

Printed circuit boards usually have interfaces supporting different kinds of storage devices and peripheral cards. For example, Socket2 is one kind of interface produced by INTEL for different kinds of devices. A +3.3 volts auxiliary voltage provides power supply for the Socket2 interface. When a wireless wide area network (WWAN) device is inserted in the Socket2 interface, the +3.3 volts auxiliary voltage provides power supply for the Socket2 interface in either working state or sleep state. When a solid state disk (SSD) device is inserted in the Socket2 interface, the SSD device only needs the power supply when in a working state.

BRIEF DESCRIPTION OF THE DRAWINGS

Implementations of the present technology will now be described, by way of example only, with reference to the attached figures.

DETAILED DESCRIPTION

Figure 1:
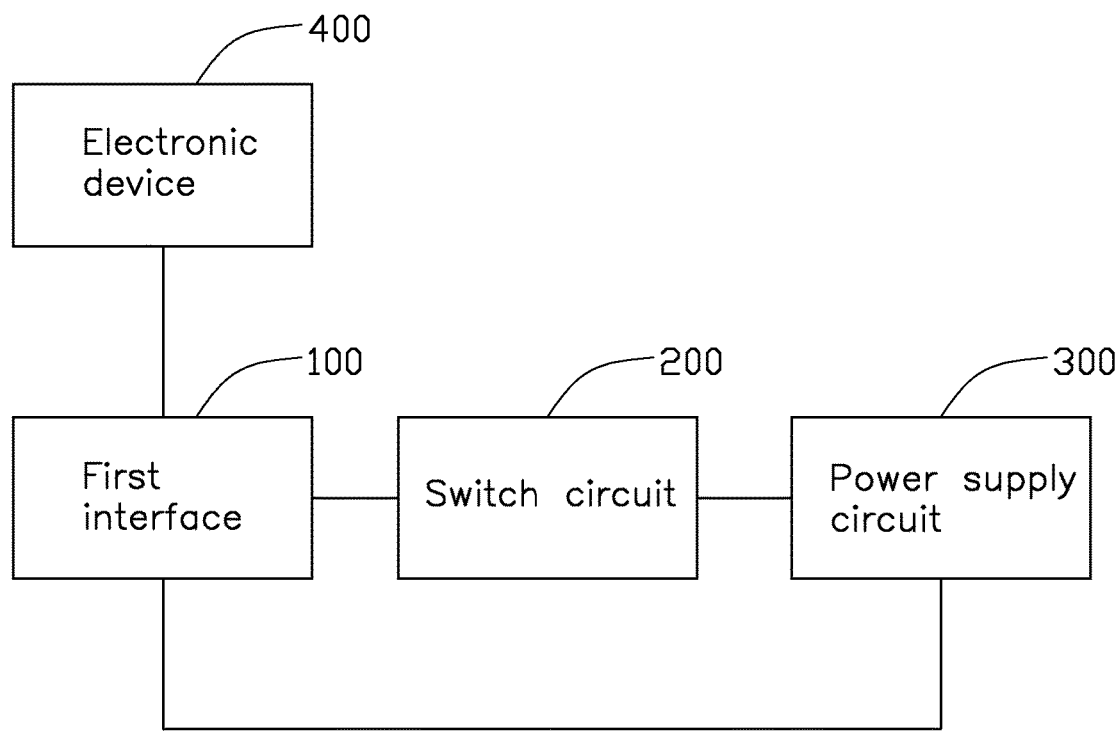
FIG. 1 is a block diagram of an embodiment of a power supply switch apparatus.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

FIG. 1 illustrates a power supply switch apparatus in accordance with an embodiment. The power supply switch apparatus includes a first interface 100, a switch circuit 200, and a power supply circuit 300. The first interface 100 is used to connect with an electronic device 400. The power supply circuit 300 provides power supply to the electronic device 400 via the first interface 100.

Figure 2:
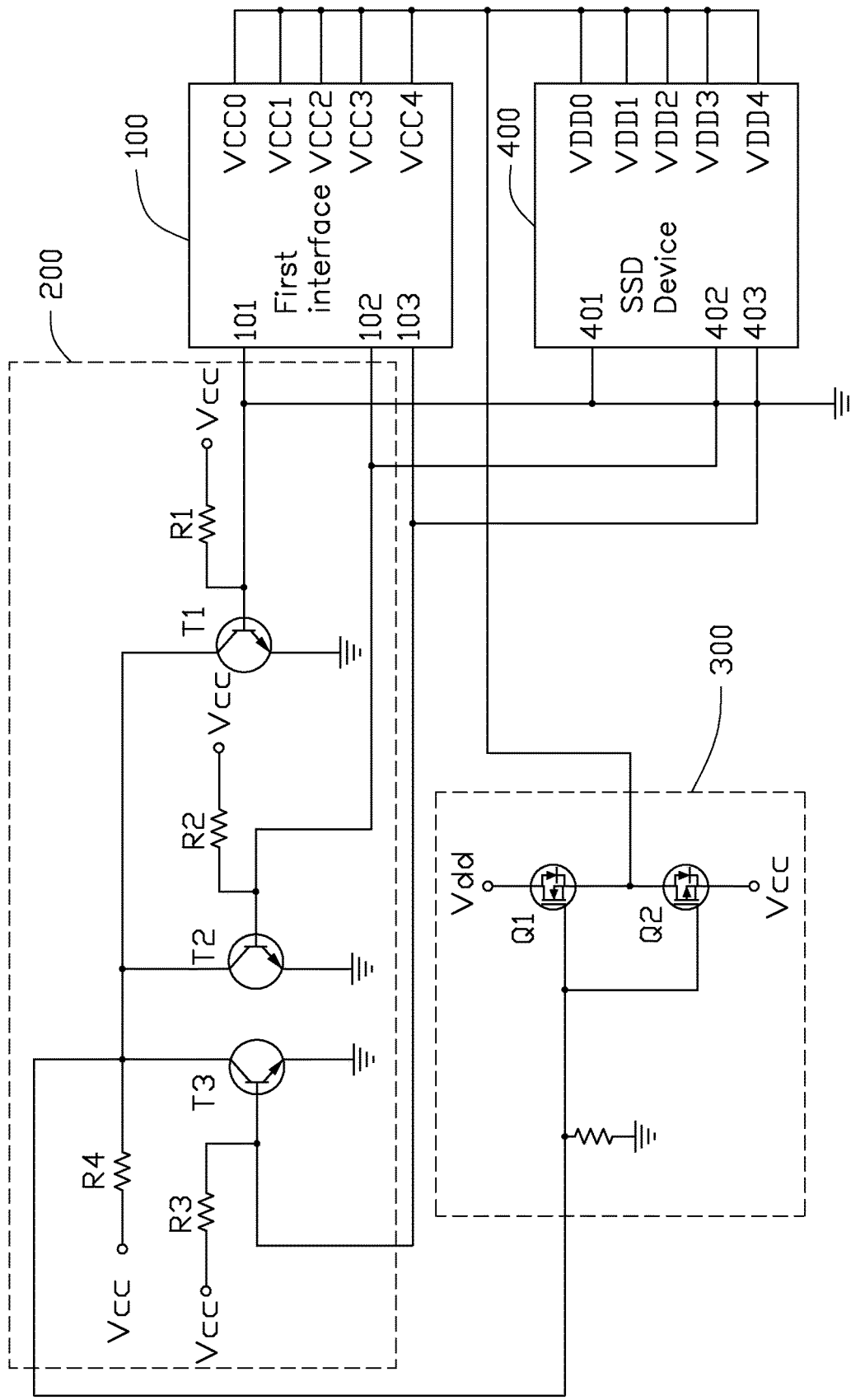
FIG. 2 is a circuit diagram of the power supply switch apparatus of FIG. 1, with a SSD device connected to the first interface.
Figure 3:
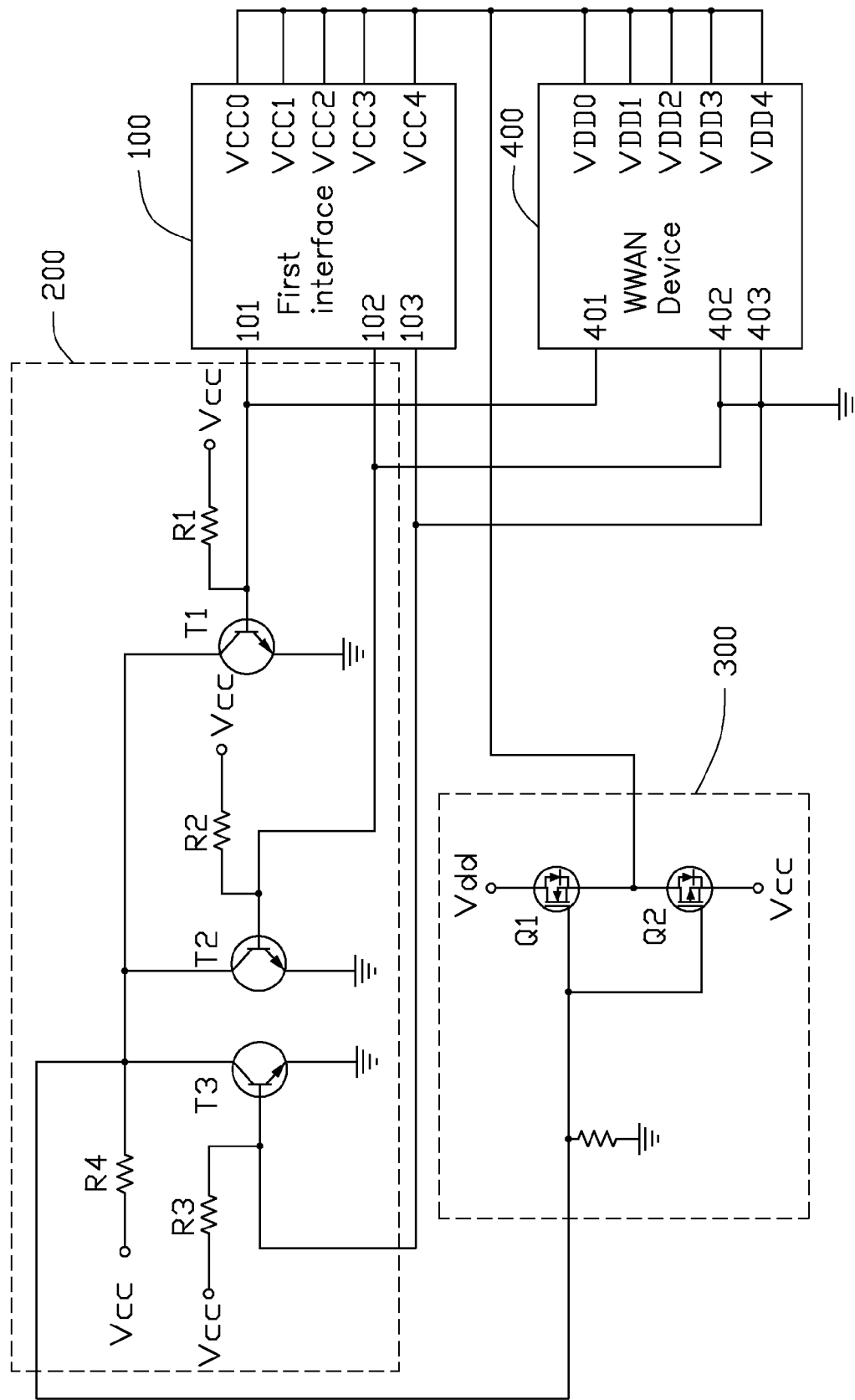
FIG. 3 is a circuit diagram of the power supply switch apparatus of FIG. 1, with a WWAN device connected to the first interface.

FIG. 2 and FIG. 3 illustrate that the first interface 100 includes a first control signal output terminal 101, a second control signal output terminal 102, a third control signal output terminal 103, and a number of power terminals VCC0, VCC1, VCC2, VCC3, VCC4. In at least one embodiment, the first interface 100 is a Socket2 interface.

The switch circuit 200 includes a first switch T1, a second switch T2, and a third switch T3. Each of the first switch T1, the second switch T2, and the third switch T3 includes a first terminal, a second terminal, and a third terminal. In at least one embodiment, the first switch T1, the second switch T2, and the third switch T3 are npn type transistors. The first terminal, the second terminal, and the third terminal of each of the first switch T1, the second switch T2, and the third switch T3 are base, emitter, and collector respectively.

The first control signal output terminal 101, the second control signal output terminal 102, and the third control signal output terminal 103 are electrically coupled to the first terminals of the first switch T1, the second switch T2, and the third switch T3 respectively. The first terminals of the first switch T1, the second switch T2, and the third switch T3 receive a first direct current (DC) voltage Vcc via a first resistor R1, a second resistor R2, and a third resistor R3 respectively. The second terminals of the first switch Tl, the second switch T2, and the third switch T3 are grounded. The third terminals of the first switch T1, the second switch T2, and the third switch T3 are electrically coupled together and receive the first DC voltage Vcc via a fourth resistor R4. In at least one embodiment, the first DC voltage Vcc is a +3.3 volts auxiliary voltage which is provided in both working state and sleeping state of a computer system.

The power supply circuit 300 includes a fourth switch Q1 and a fifth switch Q2. Each the fourth switch Q1 and the fifth switch Q2 includes a first terminal, a second terminal, and a third terminal. In at least one embodiment, the fourth switch Q1 is an n channel MOSFET. The fifth switch Q2 is an p channel MOSFET. The first terminal, the second terminal, and the third terminal of each of the fourth switch Q1 and the fifth switch Q2 are gate, source, and drain respectively.

The first terminals of the fourth switch Q1 and the fifth switch Q2 are electrically coupled to the third terminals of the first switch T1, the second switch T2, and the third switch T3. The second terminals of the fourth switch Q1 and the fifth switch Q2 receive a second DC voltage Vdd and the first DC voltage Vcc respectively. The third terminals of the fourth switch Q1 and the fifth switch Q2 are electrically coupled to the number of power terminals VCC0, VCC1, VCC2, VCC3, VCC4. In at least one embodiment, the second DC voltage Vdd is a +3.3 volts system voltage which is only provided in working state of the computer system.

The electronic device 400 includes a first connecting pin 401, a second connecting pin 402, a third connecting pin 403, and a number of power pins VDD0, VDD1, VDD2, VDD3, VDD4.

When the electronic device 400 is connected to the first interface 100, the first connecting pin 401, the second connecting pin 402, and the third connecting pin 403 are electrically coupled to the first control signal output terminal 101, the second control signal output terminal 102, and the third control signal output terminal 103 respectively, and the number of power pins VDD0, VDD1, VDD2, VDD3, VDD4 are electrically coupled to the number of power terminals VCC0, VCC1, VCC2, VCC3, VCC4. In at least one embodiment, the electronic device 400 is a solid state disk (SSD) device or a wireless wide area network (WWAN) device. The first connecting pin 401, the second connecting pin 402, and the third connecting pin 403 are all grounded in the SSD device. At least one of the first connecting pin 401, the second connecting pin 402, and the third connecting pin 403 is not grounded in the WWAN device.

FIG. 2 illustrates that in use, when a SSD device 400 is connected to the first interface 100, the first control signal output terminal 101, the second control signal output terminal 102, and the third control signal output terminal 103 all output low voltage level control signals. The first terminals of the first switch T1, the second switch T2, and the third switch T3 receive the low voltage level control signals. The first switch T1, the second switch T2, and the third switch T3 all turn off. The first terminals of the fourth switch Q1 and the fifth switch Q2 receive the first DC voltage Vcc via the fourth resistor R4. The fourth switch Q1 turns on. The fifth switch Q2 turns off. The third terminals of the fourth switch Q1 and the fifth switch Q2 output the Vdd system voltage which is provided to the number of power terminals VCC0, VCC1, VCC2, VCC3, VCC4 of the first interface 100. The +Vdd volts system voltage is only powered on in working state. The +Vdd volts system voltage will not be provided to the SSD device 400 in sleeping state, and electrical power of the SSD device 400 is saved.

FIG. 3 illustrates that when a WWAN device 400 is connected to the first interface 100, at least one of the first control signal output terminal 101, the second control signal output terminal 102, and the third control signal output terminal 103 outputs a high voltage level control signal. At least one first terminal of the first switch T1, the second switch T2, and the third switch T3 receives the high voltage level control signal. At least one of the first switch T1, the second switch T2, and the third switch T3 turns on. The first terminals of the fourth switch Q1 and the fifth switch Q2 are grounded via at least one of the first switch T1, the second switch T2, and the third switch T3. The fourth switch Q1 turns off. The fifth switch Q2 turns on. The third terminals of the fourth switch Q1 and the fifth switch Q2 output the +Vcc volts auxiliary voltage which is provided to the number of power terminals VCC0, VCC1, VCC2, VCC3, VCC4 of the first interface 100. The +Vcc volts auxiliary voltage is powered on in both working state and sleeping state, which meets electrical power requirements of the WWAN device 400.

In an original state, when no electronic device 400 is connected to the first interface 100, the first terminals of the first switch T1, the second switch T2, and the third switch T3 receive the first DC voltage Vcc via the first resistor R1, the second resistor R2, and the third resistor R3 respectively. The first switch T1, the second switch T2, and the third switch T3 all turn on. The first terminals of the fourth switch Q1 and the fifth switch Q2 are grounded via the first switch T1, the second switch T2, and the third switch T3. The fourth switch Q1 turns off. The fifth switch Q2 turns on. The third terminals of the fourth switch Q1 and the fifth switch Q2 output the Vcc volts auxiliary voltage which is provided to the number of power terminals VCC0, VCC1, VCC2, VCC3, VCC4 of the first interface 100.

The embodiments shown and described above are only examples. Many details are often found in the art such as the other features of a power supply switch apparatus. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A power supply switch apparatus comprising:
a first interface comprising a first control signal output terminal, a second control signal output terminal, and a third control signal output terminal each configured to output a control signal according to an electronic device inserted in the first interface;
a switch circuit configured to receive the control signals and output a power supply signal accordingly, wherein the switch circuit comprises a first switch, a second switch, and a third switch; each of the first switch, the second switch, and the third switch comprises a first terminal, a second terminal, and a third terminal; and
a power supply circuit configured to receive the power supply signal, and provide a first direct current (DC) voltage or a second DC voltage to the electronic device according to the power supply signal;
wherein the first interface further comprises a power terminal, the power supply circuit comprises a fourth switch; the fourth switch comprises a first terminal, a second terminal, and a third terminal; the first terminal of the fourth switch is electrically coupled to the third terminals of the first switch, the second switch, and the third switch; the second terminal of the fourth switch receives the second DC voltage; and the third terminal of the fourth switch is electrically coupled to the power terminal of the first interface.

2. The power supply switch apparatus of claim 1, wherein the first control signal output terminal, the second control signal output terminal, and the third control signal output terminal are electrically coupled to the first terminals of the first switch, the second switch, and the third switch respectively; and the second terminals of the first switch, the second switch, and the third switch are grounded.

3. The power supply switch apparatus of claim 2, wherein the first switch, the second switch, and the third switch are npn type transistors; and the first terminal, the second terminal, and the third terminal of each of the first switch, the second switch, and the third switch are base, emitter, and collector respectively.

4. The power supply switch apparatus of claim 2, wherein the power supply circuit further comprises a fifth switch; the fifth switch comprises a first terminal, a second terminal, and a third terminal; the first terminal of the fifth switch is electrically coupled to the third terminals of the first switch, the second switch, and the third switch; the second terminal of the fifth switch receives the first DC voltage; and the third terminal of the fifth switch is electrically coupled to the power terminal of the first interface.

5. The power supply switch apparatus of claim 4, wherein the fourth switch is an n channel MOSFET; the fifth switch is an p channel MOSFET; and the first terminal, the second terminal, and the third terminal of each of the fourth switch and the fifth switch are gate, source, and drain respectively.

6. The power supply switch apparatus of claim 4, wherein when a first device is connected to the first interface, the first control signal output terminal, the second control signal output terminal, and the third control signal output terminal all output low voltage level control signals, the first switch, the second switch, and the third switch all turn off, the fourth switch turns on, the fifth switch turns off, and the third terminals of the fourth switch and the fifth switch output the second DC voltage which is provided to the power terminal of the first interface.

7. The power supply switch apparatus of claim 6, wherein when a second device is connected to the first interface, at least one of the first control signal output terminal, the second control signal output terminal, and the third control signal output terminal outputs a high voltage level control signals, at least one of the first switch, the second switch, and the third switch turns on, the fourth switch turns off, the fifth switch turns on, and the third terminals of the fourth switch and the fifth switch output the first DC voltage which is provided to the power terminal of the first interface.

8. The power supply switch apparatus of claim 7, wherein the first interface is a Socket2 interface, the first device is a solid state disk (SSD) device; and the second device is a wireless wide area network (WWAN) device.

9. The power supply switch apparatus of claim 1, wherein the first DC voltage is a +3.3 volts auxiliary voltage; and the second DC voltage is a +3.3 volts system voltage.

10. A power supply switch apparatus comprising:
a first interface comprising a first control signal output terminal, a second control signal output terminal, and a third control signal output terminal each configured to output a control signal according to an electronic device inserted in the first interface;
a switch circuit configured to receive the control signals and output a power supply signal accordingly; and
a power supply circuit comprising a fourth switch and a fifth switch and configured to receive the power supply signal, and provide a first direct current (DC) voltage or a second DC voltage to the electronic device according to the power supply signal,
wherein when a first device is connected to the first interface, the first control signal output terminal, the second control signal output terminal, and the third control signal output terminal all output low voltage level control signals, a first switch, a second switch, a third switch all turn off, the fourth switch turns on, the fifth switch turns off, and the fourth switch and the fifth switch output the second DC voltage which is provided to the power terminal of the first interface; and
wherein when a second device is connected to the first interface, at least one of the first control signal output terminal, the second control signal output terminal, and the third control signal output terminal outputs a high voltage level control signals, at least one of the first switch, the second switch, and the third switch turns on, the fourth switch turns off, the fifth switch turns on, and the fourth switch and the fifth switch output the first DC voltage which is provided to the power terminal of the first interface.

11. The power supply switch apparatus of claim 10, wherein the switch circuit comprises a first switch, a second switch, and a third switch; each of the first switch, the second switch, and the third switch comprises a first terminal, a second terminal, and a third terminal; the first control signal output terminal, the second control signal output terminal, and the third control signal output terminal are electrically coupled to the first terminals of the first switch, the second switch, and the third switch respectively; and the second terminals of the first switch, the second switch, and the third switch are grounded.

12. The power supply switch apparatus of claim 11, wherein the first switch, the second switch, and the third switch are npn type transistors; and the first terminal, the second terminal, and the third terminal of each of the first switch, the second switch, and the third switch are base, emitter, and collector respectively.

13. The power supply switch apparatus of claim 11, wherein the first interface further comprises a power terminal; each of the fourth switch and the fifth switch comprises a first terminal, a second terminal, and a third terminal; the first terminals of the fourth switch and the fifth switch are electrically coupled to the third terminals of the first switch, the second switch, and the third switch; the second terminals of the fourth switch and the fifth switch receive the second DC voltage and the first DC voltage respectively; and the third terminals of the fourth switch and the fifth switch are electrically coupled to the power terminal of the first interface.

14. The power supply switch apparatus of claim 13, wherein the fourth switch is an n channel MOSFET; the fifth switch is an p channel MOSFET; and the first terminal, the second terminal, and the third terminal of each of the fourth switch and the fifth switch are gate, source, and drain respectively.

15. The power supply switch apparatus of claim 13, wherein when a first device is connected to the first interface, the first control signal output terminal, the second control signal output terminal, and the third control signal output terminal all output low voltage level control signals, the first switch, the second switch, and the third switch all turn off, the fourth switch turns on, the fifth switch turns off, and the third terminals of the fourth switch and the fifth switch output the second DC voltage which is provided to the power terminal of the first interface.

16. The power supply switch apparatus of claim 15, wherein when a second device is connected to the first interface, at least one of the first control signal output terminal, the second control signal output terminal, and the third control signal output terminal outputs a high voltage level control signals, at least one of the first switch, the second switch, and the third switch turns on, the fourth switch turns off, the fifth switch turns on, and the third terminals of the fourth switch and the fifth switch output the first DC voltage which is provided to the power terminal of the first interface.

17. The power supply switch apparatus of claim 16, wherein the first interface is a Socket2 interface, the first device is a solid state disk (SSD) device; and the second device is a wireless wide area network (WWAN) device.

18. The power supply switch apparatus of claim 10, wherein the first DC voltage is a +3.3 volts auxiliary voltage; and the second DC voltage is a +3.3 volts system voltage.

19. A power supply arrangement, comprising:
a first interface configured to detect whether the interface is connected to an electronic device, to provide power to the electronic device when connected, and to detect characteristics of a type of the electronic device when connected;
the first interface having a plurality of control outputs configured to output different control states in response to a presence or absence of a connection to the electronic device, and the type of electronic device when connected; and a switching circuit including a plurality of switches, each connected to respective ones of the plurality of control outputs;

a first power supply circuit connected to and controlled by the switching circuit, and configured to output first and second DC voltages to the first interface;

wherein when a first type of electronic device is connected to the first interface, the plurality of control outputs turn all switches in the switching circuit OFF, which drives the power supply circuit to send the first DC voltage to the first interface;

wherein when a second type of electronic device is connected to the first interface, the plurality of control outputs turn at least some but not all of the switches in the switching circuit ON, which drives the power supply circuit to send the second DC voltage to the first interface;

wherein when no electronic device is connected to the first interface, the plurality of control outputs turn all of the switches in the switching circuit ON, which drives the power supply circuit to send the second DC voltage to the first interface.

* * * * *